United States Patent
Yu et al.

(10) Patent No.: US 8,902,577 B2
(45) Date of Patent: Dec. 2, 2014

(54) COMPOSITE CARD-TYPE STRUCTURE HAVING AN INTEGRATED CIRCUIT MODULE AND A CARRIER

(75) Inventors: Hong-Chi Yu, Kaohsiung (TW); Mao-Ting Chang, Kaohsiung (TW)

(73) Assignee: Walton Advanced Engineering Inc., Kaohsiung (TW)

( * ) Notice: Subject to any disclaimer, the term of this patent is extended or adjusted under 35 U.S.C. 154(b) by 259 days.

(21) Appl. No.: 13/604,980

(22) Filed: Sep. 6, 2012

(65) Prior Publication Data
US 2014/0036432 A1 Feb. 6, 2014

(30) Foreign Application Priority Data

Jul. 31, 2012 (TW) .............................. 101127580 A

(51) Int. Cl.
G06F 1/32 (2006.01)

(52) U.S. Cl.
USPC .................................................... 361/679.32

(58) Field of Classification Search
USPC ............. 439/342, 264–268; 361/679.32, 728, 361/730
See application file for complete search history.

(56) References Cited

U.S. PATENT DOCUMENTS

| | | | |
|---|---|---|---|
| 6,722,911 B2 * | 4/2004 | Ye | 439/342 |
| 6,797,891 B1 * | 9/2004 | Blair et al. | 174/268 |
| 8,488,310 B2 * | 7/2013 | Yu et al. | 361/679.32 |
| 8,498,105 B2 * | 7/2013 | Yu et al. | 361/679.32 |
| 2012/0120585 A1 * | 5/2012 | Yu et al. | 361/679.32 |
| 2012/0268898 A1 * | 10/2012 | Hong-Chi et al. | 361/728 |

* cited by examiner

Primary Examiner — Chandrika Prasad
(74) Attorney, Agent, or Firm — Bacon & Thomas, PLLC

(57) ABSTRACT

The present invention relates to a card-type composite interface structure comprising at least an integrated circuit module and a carrier: the carrier's height exactly matches a card reader's height and a composite connector's metal contacts are securely and electrically connected to a card reader when the carrier with the integrated circuit module mounted is inserted into a card reader; a support pad which is removed out of the carrier and toward the carrier's lower surface has its length exactly matching the height of a USB port in one computer in order to reliably sustain a supporting segment and make the composite connector's metal contacts electrically connected to the USB port when a driven structure is shifted to a default direction under effect of a user's force.

15 Claims, 6 Drawing Sheets

COMPOSITE CARD-TYPE STRUCTURE HAVING AN INTEGRATED CIRCUIT MODULE AND A CARRIER

BACKGROUND OF THE INVENTION

1) Field of the Invention

The present invention provides a card-type carrier that features a thin composite transmission interface in which there are metal contacts available to a smart card and a universal serial bus via a composite design and is developed to be a separable and fordable structure which is compatible to interfaces of both the smart card and the universal serial bus.

2) Description of the Prior Art

Internet technologies and portable devices which are known as convenience and speed have significantly progressed in recent years. Among portable devices, the portable data storage device with a data transfer interface and one type of non-volatile memory (for instance, flash memory) integrated has been substantially popularized. On the other hand, a portable device with the USB (Universal Serial Bus) data transfer interface combined which features some advantages such as lightness, portability, and plug-and-play attracts the public's interests.

For example, the multi-functional data storage device (R.O.C. Patent No. M328060 (FIG. 1)) comprises a flat case (60) manufactured to be a business card with an integrated circuit module to which a signal cable (61) and a USB (Universal Serial Bus) Series A male connector (62) of the signal cable (61) are connected. The case (60) comprises a first panel (601) and a second panel (602) wherein the first panel (601) is provided with two grooves connected each other such as a narrow wire groove (603) on its surface and a rectangular connector groove (604) to accommodate a USB Series A male connector (62) and the second panel (602) is printed with verified patterns, characters, or trademarks according to each demand of an enterprise (the government or an individual) for specific matters, advertisements, propaganda or instructions to operate specific matters. As a result, the case similar to a business card for conventional printed advertisements as well as digital data simultaneously combined and expressed makes some specific matters amply and completely displayed.

However, referring to FIGS. 2A and 2B which illustrate a USB Series A male connector (70) as well as a USB Series A female connector (80) (unit: millimeter) wherein the USB Series A male connector (70) has a metal frame (71) with the thickness of 4.5 mm±0.1 mm and a partial thickness space (72) to accommodate a plurality of metal contacts (83) and a carrier (84) of the female connector (80) according to standards of the USB data transfer interface. Then, a thickness space (82) in the female connector (80) between 2.0 and 2.3 mm is used to accommodate a plurality of metal contacts (73) and a carrier (74) of the male connector (70). That is, the distance from the carrier (84) to the outer frame (81) of the female connector (80) is equal to the minimum thickness of the male connector (70).

Accordingly, the thickness of 4.5 mm±0.1 mm for the male connector (70) along with the metal frame (71) under restrictions of standard specifications cannot be thinner and causes a USB Series A male connector not to be thinner or effectively connected to any other products such as credit card, ATM card, personal ID card (thickness between 1.7 and 1.9 mm), general business card (thickness between 0.3 and 0.5 mm) and promotional cardboard (thickness between 1.0 and 2.0 mm) without creation of further purposes despite products based on R.O.C. Patent No. M328060 being available in the market.

SUMMARY OF THE INVENTION

To settle the above problems, the present invention provides a card-type composite interface structure with an interface compatible to both a smart card and a universal serial bus through a separable and foldable manner.

Accordingly, the object of the present invention is to provide a card-type composite interface structure effectively integrating specifications of both a smart card and a universal serial bus.

The other object of the present invention is to provide a card-type composite interface structure simplifying two structural systems and minimizing manufacturing costs.

The further object of the present invention is to provide a card-type composite interface structure simplifying individual controllers initially required by a smart card and a universal serial bus to be one unit of controllers.

The yet other object of the present invention is to provide a card-type composite interface structure simplifying individual metal contacts initially required by a smart card and a universal serial bus to be one unit of metal contacts.

The yet still other object of the present invention is to provide a card-type composite interface structure featuring simplified material control by integrating two types of specifications.

The yet still further object of the present invention is to provide a card-type composite interface structure easily portable with two types of specifications integrated.

The yet still further object of the present invention is to provide a card-type composite interface structure which is foldable and makes a Universal Serial Bus (USB) interface more compact.

To achieve the above purposes, the present invention adopts the following technical measures. A card-type composite interface structure comprises at least an integrated circuit module and a carrier: (1) the integrated circuit module comprises a substrate, at least an electronic component, and a composite connector: (a) the substrate has an internal surface and an external surface; (b) the electronic component is disposed at the internal surface or the external surface; (c) the composite connector is provided with at least a metal contact which is electrically connected to the electronic components via a circuit on the substrate; (2) the carrier comprises a driven structure which is movably held in the carrier and equipped with a supporting segment and a support pad wherein the supporting segment is next to the support pad and used to sustain the integrated circuit module; (3) features: the carrier's height exactly matches the card reader's height and the composite connector's metal contacts are reliably and electrically connected to the card reader when the carrier with the integrated circuit module mounted is inserted into a card reader by one user; the composite connector's metal contacts are reliably and electrically connected to a computer's USB port whose height exactly matching the support pad's length for development of a stable supporting segment when the support pad is removed out of the carrier and toward a lower surface of the carrier under effect of a user's acting force.

The purposes and technical issues with regard to the present invention are further fulfilled by the following technical measures.

In the above card-type composite interface structure, the support pad's length is greater than or equal to 1 mm.

In the above card-type composite interface structure, the driven structure has at least a sliding member installed on at least one lateral margin.

In the above card-type composite interface structure, the carrier is equipped with a track being at one lateral margin and corresponding to the sliding member so that the sliding member is held and moved inside the track.

In the above card-type composite interface structure, the track runs through the carrier and the sliding member makes the driven structure move out of the carrier via the track.

In the above card-type composite interface structure, the track does not run through the carrier and the sliding member is movably held in the track.

In the above card-type composite interface structure, the integrated circuit module's height is less than or equal to 1 mm.

In the above card-type composite interface structure, the electronic component comprises at least a memory unit and a control unit.

In the above card-type composite interface structure, the driven structure is held in an accommodating space of the carrier and the accommodating space runs through the carrier.

In the above card-type composite interface structure, the driven structure is held in an accommodating space of the carrier and the accommodating space does not run through the carrier.

In the above card-type composite interface structure, the supporting segment and the support pad are designed to be a one-piece structure with a bridge piece installed between the two components.

In the above card-type composite interface structure, the supporting segment and the support pad are separable in their design wherein the supporting segment is next to the support pad by a clearance and adjoins the support pad with at least an adhesive film.

In the above card-type composite interface structure, the metal contacts are exposed from the adhesive film.

In the above card-type composite interface structure, the support pad is manufactured with a flexible material.

In the above card-type composite interface structure, the supporting segment intersects the support pad to develop an interior angle less than 90 degrees when the support pad is moved out of the carrier and toward the carrier's lower surface.

In contrast to prior arts, the present invention features a USB connector's metal contacts electrically connected to a USB port in virtue of a support pad's length exactly matching the USB port's height for development of a stable supporting segment; the electrical link between the USB connector's metal contacts and a computer's USB port is always available without failure even if the integrated circuit module's thickness is thinner. The integrated circuit module's reduced thickness is of service to other card-type products linking the present invention and one product effectively thinned.

BRIEF DESCRIPTIONS OF THE DRAWINGS

DETAILED DESCRIPTIONS OF THE PREFERRED EMBODIMENTS

In order to ensure purposes, characteristics, and effects of the present invention substantially understood, some preferred embodiments in regard to the present invention are particularly specified as follows. FIG. 3 through FIG. 9 illustrate the principal embodiment of the present invention of a card-type composite interface structure (1).

Figure 1:
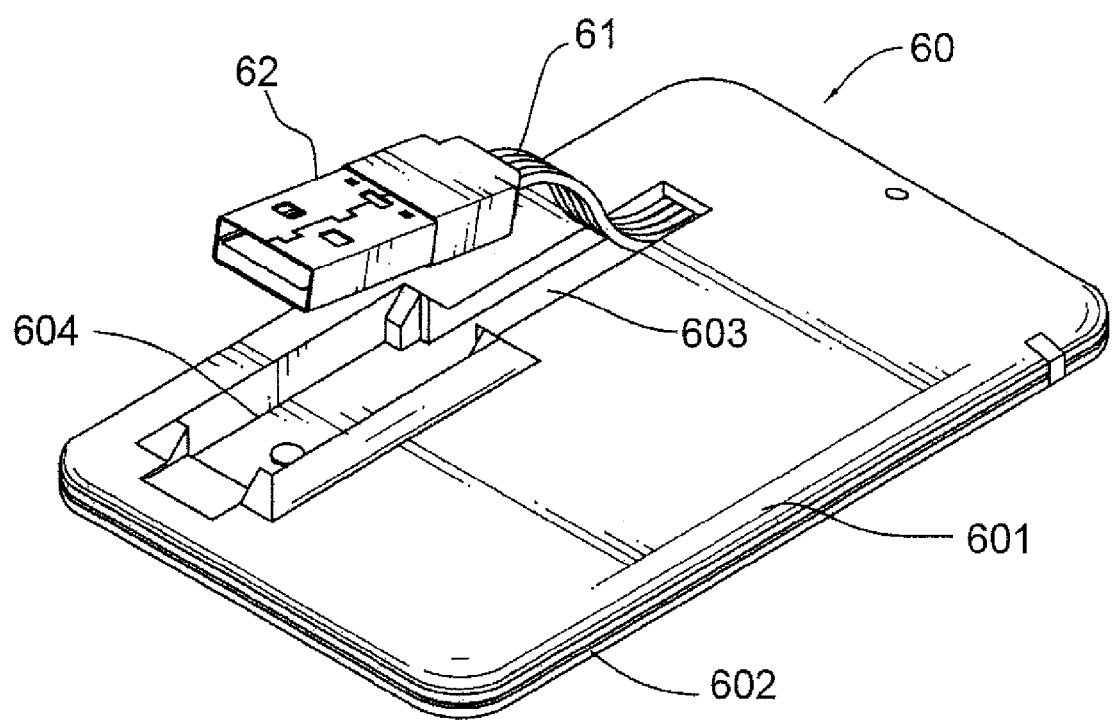
FIG. 1 is a schematic perspective view of a conventional card structure based on prior arts.
Figure 2A:
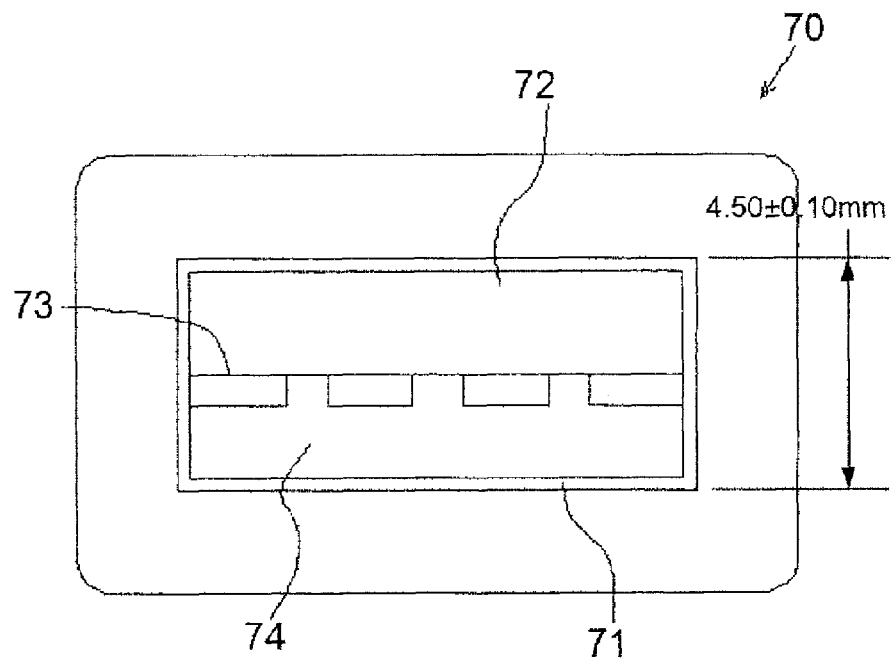
FIG. 2A is a sectional view of a USB (Universal Serial Bus) Series A male connector.
Figure 2B:
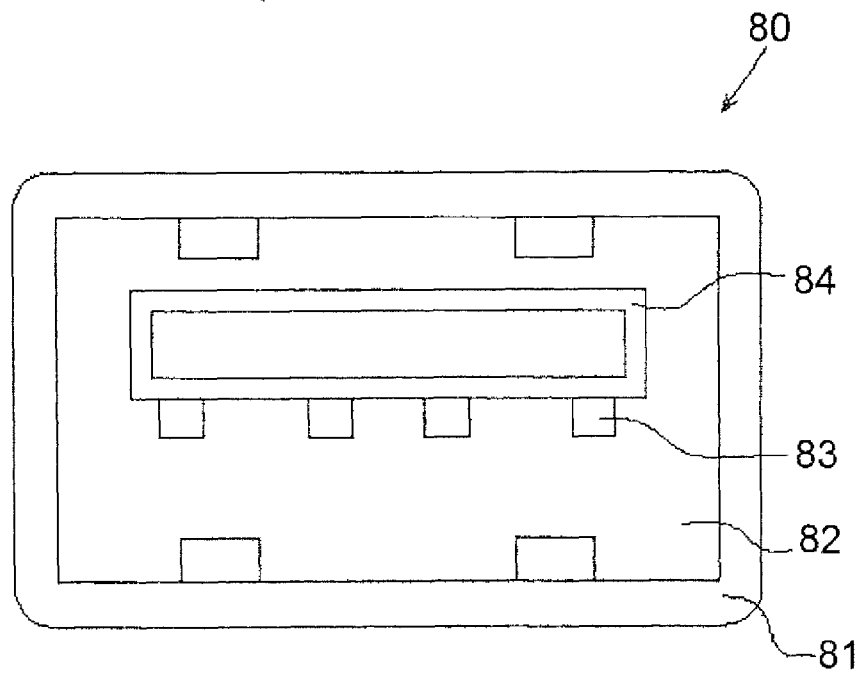
FIG. 2B is a sectional view of a USB (Universal Serial Bus) Series A female connector.
Figure 3:
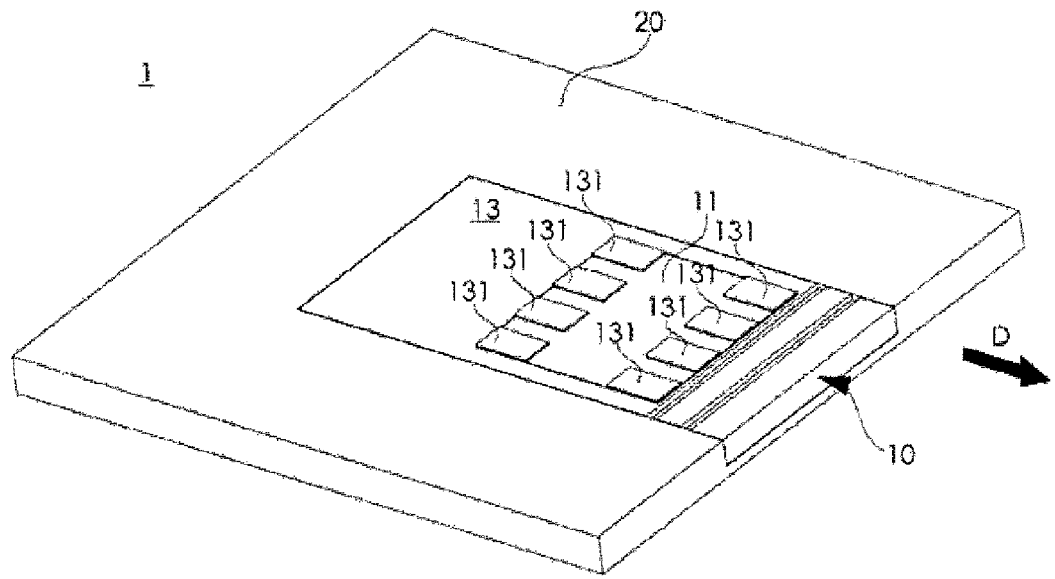
FIG. 3 is the first perspective view of the present invention in a preferred embodiment.
Figure 4:
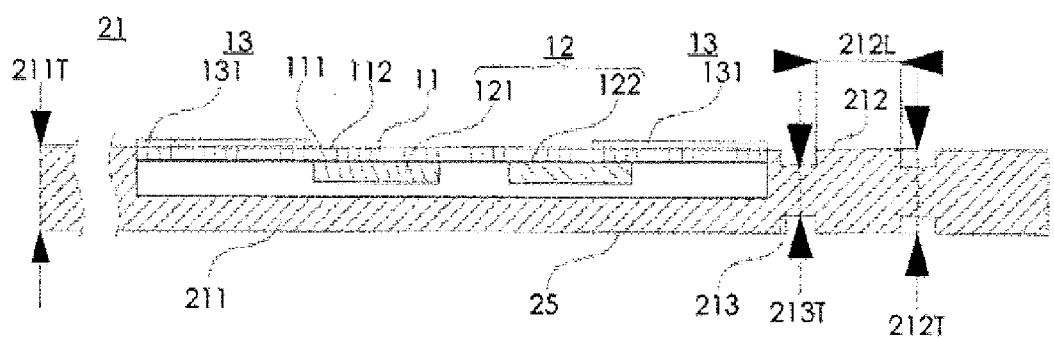
FIG. 4 is the first sectional view of the present invention in a preferred embodiment.
Figure 5:
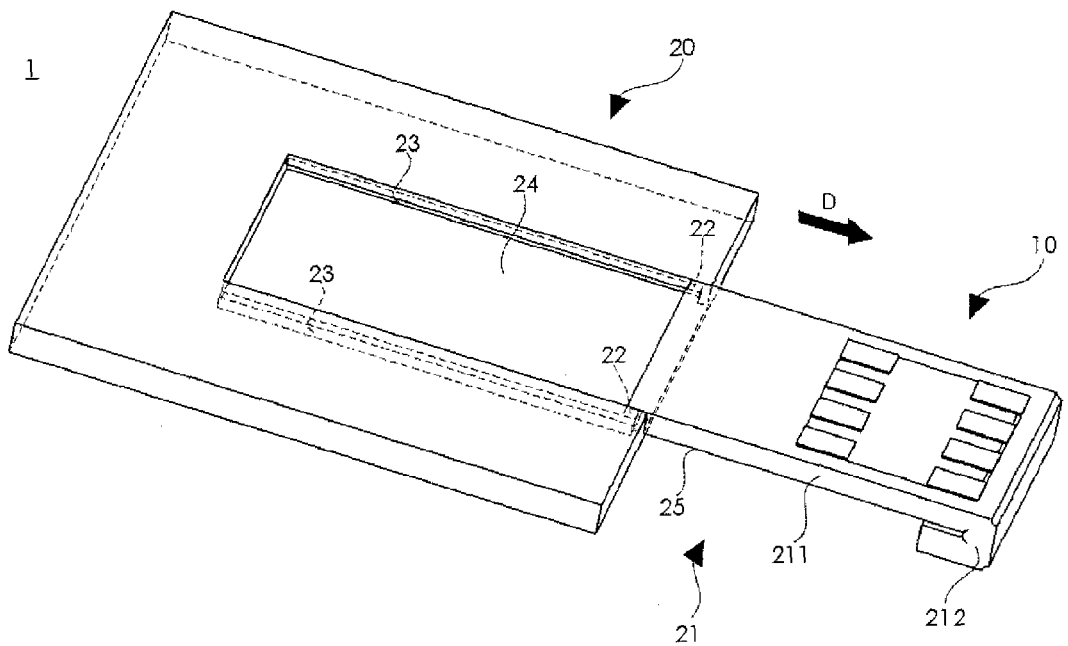
FIG. 5 is the second perspective view of the present invention in a preferred embodiment.

Referring to FIG. 3 through FIG. 5 which illustrate a card-type composite interface structure (1) comprises at least an integrated circuit module (10) and a carrier (20).

As partially shown in FIG. 4, the integrated circuit module (10) comprises a substrate (11), at least an electronic component (12) and a composite connector (13): the substrate (11) has an internal surface (111) and an external surface (112) so that the electronic components (12) is disposed at one of the surfaces; the composite connector (13) is provided with at least a metal contact (131) and electrically connected to the electronic components (12) via a circuit on the substrate (11).

Specifically, referring to FIG. 4 which illustrates the electronic component (12) comprises at least a memory unit (121) and a control unit (122): the memory unit (121) provides readable/writable digital data; the control unit (122) which is electrically connected between the memory unit (121) and the metal contacts (131) of the composite connector (13) issues a demand for data flow and controls data flow. Digital data can be exchanged with the metal contacts (131) of the composite connector (13) plugged into a USB port (31) on a computer (3) (also shown in FIG. 6). Furthermore, passive components (not shown in the figure) required by the integrated circuit module (20) are also disposed at the internal surface (111) or the external surface (112) of the substrate (11).

As partially shown in FIG. 5, the carrier (20) comprises a driven structure (21) movably held in the carrier (20) and comprising a supporting segment (211) and a support pad (212) wherein the supporting segment (211) is next to the support pad (212) and used to sustain the integrated circuit module (10).

Figure 8:
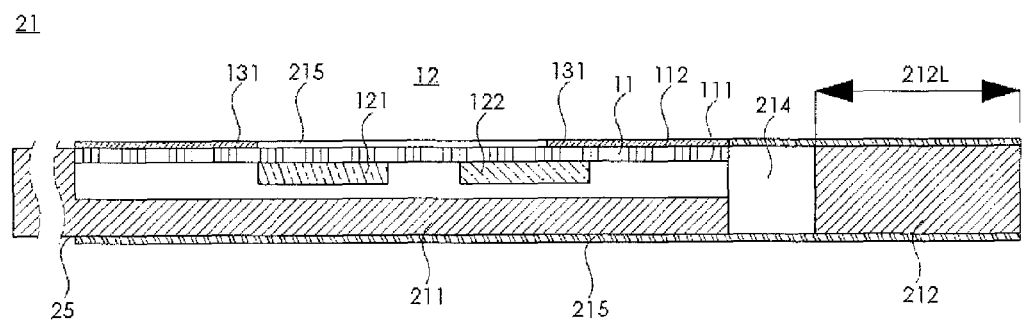
FIG. 8 is the second sectional view of the present invention in a preferred embodiment.
Figure 9:
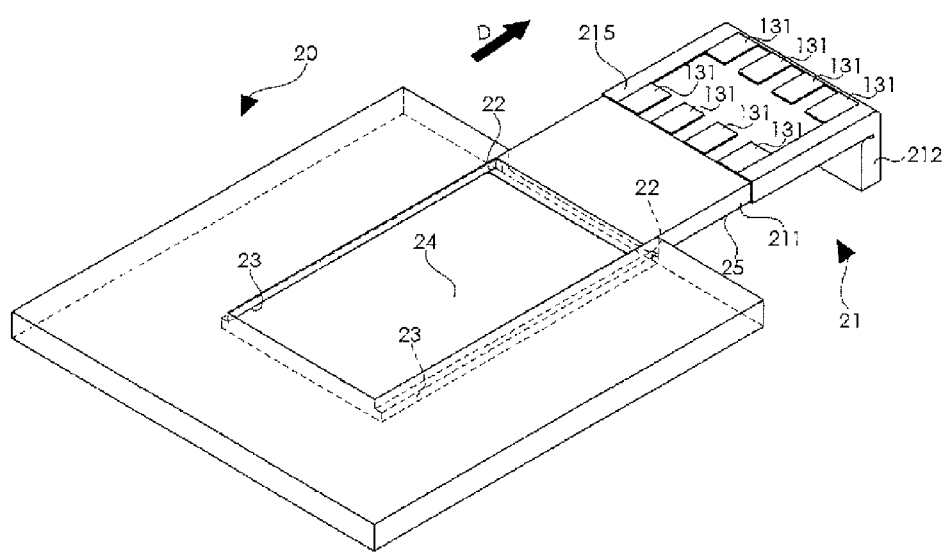
FIG. 9 is the third perspective view of the present invention in a preferred embodiment.

In practice, referring to FIGS. 5 and 9 which illustrate the driven structure (21) is installed in an accommodating space (24) of the carrier (20) and the accommodating space (24) run or does not run through the carrier (20) (not shown in figures). As shown in FIG. 4, the supporting segment (211) and the support pad (212) manufactured with a flexible material are designed to be a one-piece structure and provided with a bridge piece (213) in between; as shown in FIG. 8, the supporting segment (211) and the support pad (212) are separable in their design wherein the supporting segment (211) depends on a clearance (214) to adjoin the support pad (212) and adheres to the support pad (212) with at least an adhesive film (215); the metal contacts (131) are exposed from the adhesive film (215).

Figure 6:
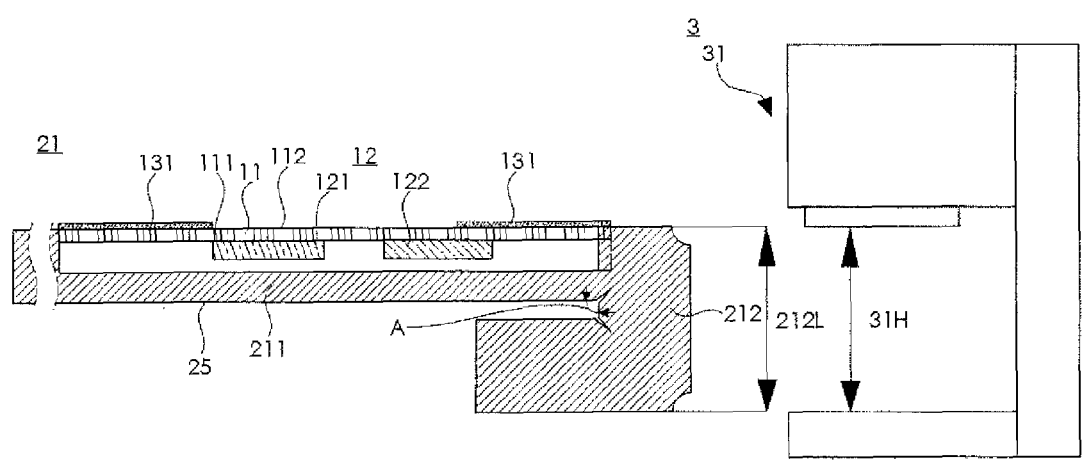
FIG. 6 is the first schematic view of using a USB interface with respect to the present invention in a preferred embodiment.
Figure 7:
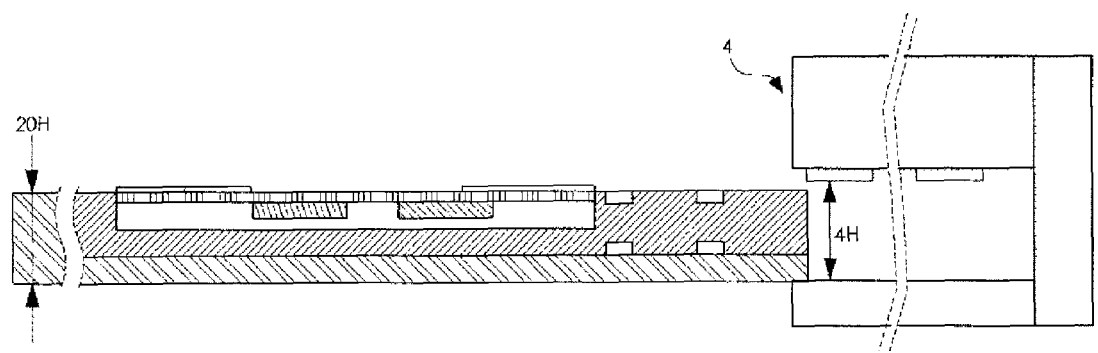
FIG. 7 is a schematic view of using a smart card interface with respect to the present invention in a preferred embodiment.

To match specifications for thickness of one device used in a smart card, the height of the integrated circuit module (10) is not more than 1 mm and the height (20H) of the carrier (20) is exactly equal to the height (414) of the card reader (4) (as shown in FIG. 7) so that the metal contacts (131) of the composite connector (13) are securely and electrically connected to the card reader (4). Referring to FIGS. 4 and 8 which illustrate the present invention is compatible to specifications of a universal serial bus wherein the length (212L) of the folded support pad (212) (FIG. 6) or the thickened support pad (212) (FIG. 10), not less than 1 mm, is of service to availability of a universal serial bus.

Figure 10:
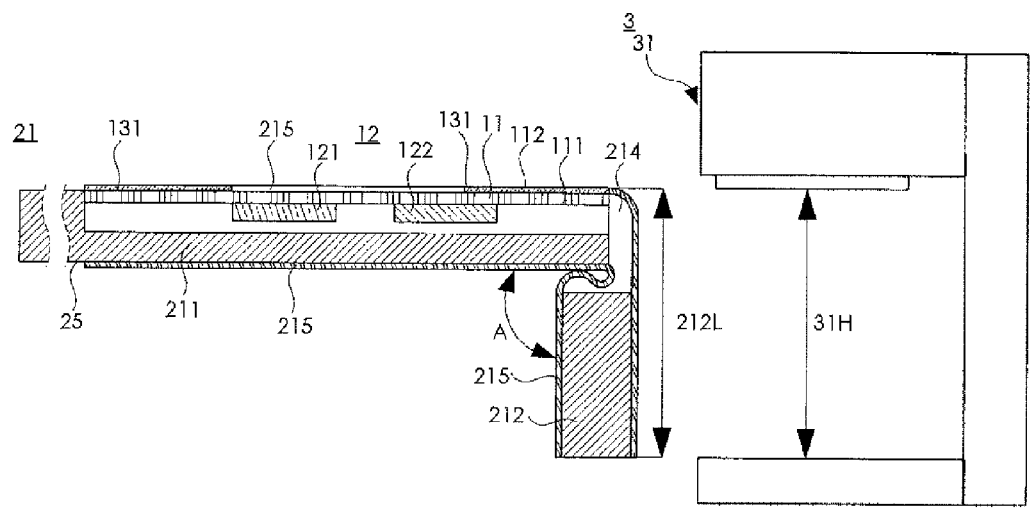
FIG. 10 is the second schematic view of using a USB interface with respect to the present invention in a preferred embodiment.

As shown in FIG. 6 and FIG. 10, the folded support pad (212) which is removed from the carrier (20) and toward the lower surface (25) of the carrier (20) makes an interior angle (A) due to the supporting segment (211) intersecting the support pad (212) smaller than 90 degrees. It is notable that design of a foldable bridge piece (FIG. 4 through FIG. 6) or a clearance (FIG. 8 through FIG. 10) is intended for smoothly shifting the support pad (212) to the lower surface (25) of the supporting segment (211). However, the present invention should not limited to this case, for example, the supporting segment (211) and the support pad (212) can be designed to comprise a "Λ-shape gap" in between (not shown in figures) by which the support pad (212) can be smoothly shifted to the lower surface (25) of the supporting segment (211) when the support pad (32) is removed outward. Therefore, any technical measure known as common sense in this field should not restrict the present invention.

For convenient operations, the driven structure (21) has at least a sliding member (22) installed on one lateral margin and corresponding to a track (23) which is located at a lateral margin of the sliding member (22) so that the sliding member (22) is moved inside the track (23): (a) the track (23) running through the carrier (20): the sliding member (22) enables the driven structure (21) to depart from the carrier (20) via the track (23); (b) the track (23) not running through the carrier (20): the sliding member (22) is movably held in the track (23) to avoid the integrated circuit module (10) out of the accommodating space (24) of the carrier (20) accidentally.

The present invention of a card-type composite interface structure is further explained in a preferred embodiment for the detailed operations hereinafter.

Referring to FIGS. 3 and 7 which illustrate the carrier (20) with the integrated circuit module (10) mounted is inserted into a card reader (4) and the metal contacts (131) of the composite connector (13) is securely and electrically connected to the card reader (4) due to the height (20H) of the carrier (20) exactly matching the height (4H) of the card reader (4).

Referring to FIGS. 3 and 5 which illustrate the support pad (212) is shifted out of the carrier (20) and toward a lower surface (25) of the carrier (20) when the driven structure (21) under effect of a user's acting force is removed along a default direction (D). Referring to FIG. 6 which illustrates the supporting segment (211) is securely supported and the metal contacts (131) of the composite connector (13) are reliably and electrically connected to the USB port (31) when the length (212L) of the support pad (212) exactly matches the height (31H) of a USB port (31) in a computer (3).

Accordingly, the present invention with effects different from conventional smart cards or universal serial buses and referred to as creative work among relevant applications meets patentability and is applied for the patent.

It must be reiterated that the said descriptions are the preferred embodiments of the present invention only, and any equivalent change in specifications, claims, or drawings of the present invention still belongs to the technical field within the present invention with reference to claims hereinafter.

What is claimed is:

1. A card-type composite interface structure (1) comprising at least an integrated circuit module (10) and a carrier (20) wherein Said integrated circuit module (10) comprises A substrate (11), at least an electronic component (12), and a composite connector (13):

Said substrate (11) has an internal surface (111) and an external surface (112);

Said electronic component (12) is disposed at said internal surface (111) or said external surface (112);

Said composite connector (13) is provided with at least a metal contact (131) and electrically connected to said electronic components (12) via a circuit on said substrate (11);

Said carrier (20) comprises

A driven structure (21) which is movably held in said carrier (20) and comprises a supporting segment (211) and a support pad (212): said supporting segment (211) is next to said support pad (212) and said supporting segment (211) sustains said integrated circuit module (10); and wherein, Said metal contacts (131) of said composite connector (13) are reliably and electrically connected to said card reader (4) when said carrier (20) with said integrated circuit module (10) mounted is inserted into a card reader (4) by a user and the height (20H) of said carrier (20) exactly matches the height (4H) of said card reader (4); in the case of said driven structure (21) removed along a default direction (D) under effect of the user's acting force: said support pad (212) is shifted out of said carrier (20) and toward a lower surface (25) of said carrier (20); the length (212L) of said support pad (212) exactly matches the height (31H) of a USB port (31) in a computer (3) and reliably supports said supporting segment (211); said metal contacts (131) of said composite connector (13) are securely and electrically connected to said USB port (31).

2. A card-type composite interface structure (1) according to claim 1 wherein the length (212L) of said support pad (212) is greater than or equal to 1 mm.

3. A card-type composite interface structure (1) according to claim 1 wherein said driven structure (21) has at least a sliding member (22) installed on one lateral margin.

4. A card-type composite interface structure (1) according to claim 3 wherein said carrier (20) has a track (23) which is located at one lateral margin and corresponds to said sliding member (22) so that said sliding member (22) is moved and held inside the track (23).

5. A card-type composite interface structure (1) according to claim 4 wherein said track (23) runs through said carrier (20) and said sliding member (22) makes said driven structure (21) movably depart from said carrier (20) via said track (23).

6. A card-type composite interface structure (1) according to claim 4 wherein said track (23) does not run through said carrier (20) and said sliding member (22) is moved and held inside the track (23).

7. A card-type composite interface structure (1) according to claim 1 wherein said integrated circuit module (10) has a height less than or equal to 1 mm.

8. A card-type composite interface structure (1) according to claim 1 wherein said electronic component (12) comprises at least a memory unit (121) and a control unit (122).

9. A card-type composite interface structure (1) according to claim 1 wherein said driven structure (21) is installed in an accommodating space (24) of said carrier (20) and said accommodating space (24) runs through said carrier (20).

10. A card-type composite interface structure (1) according to claim 1 wherein said driven structure (21) is held in an accommodating space (24) of said carrier (20) and said accommodating space (24) does not run through said carrier (20).

11. A card-type composite interface structure (1) according to claim 1 wherein both said supporting segment (211) and said support pad (212) are designed to be a one-piece structure and provided with a bridge piece (213) in between.

12. A card-type composite interface structure (1) according to claim 1 wherein both said supporting segment (211) and said support pad (212) are separable in their design and said supporting segment (211) adjoins said support pad (212) by a clearance (14) and adheres to said support pad (212) with at least an adhesive film (215).

13. A card-type composite interface structure (1) according to claim 11 wherein said metal contacts (131) are exposed from said adhesive film (215).

14. A card-type composite interface structure (1) according to claim 1 wherein said support pad (212) is manufactured with a flexible material.

15. A card-type composite interface structure (1) according to claim 1 wherein said supporting segment (211) intersects said support pad (212) to develop an interior angle (A) less than 90 degrees when said support pad (212) is moved out of said carrier (20) and toward said lower surface (25) of said carrier (20).

* * * * *